(12) United States Patent
Guo et al.

(10) Patent No.: US 12,219,727 B2
(45) Date of Patent: Feb. 4, 2025

(54) CIRCUIT BOARD ASSEMBLY AND ELECTRONIC DEVICE

(71) Applicant: HONOR DEVICE CO., LTD., Shenzhen (CN)

(72) Inventors: Jianqiang Guo, Shenzhen (CN); Wenjun Luo, Shenzhen (CN); Fan Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/025,470

(22) PCT Filed: Aug. 18, 2022

(86) PCT No.: PCT/CN2022/113347
§ 371 (c)(1),
(2) Date: Mar. 9, 2023

(87) PCT Pub. No.: WO2023/040572
PCT Pub. Date: Mar. 23, 2023

(65) Prior Publication Data
US 2024/0206102 A1    Jun. 20, 2024

(30) Foreign Application Priority Data
Sep. 18, 2021  (CN) .......................... 202111113468.8

(51) Int. Cl.
*H05K 7/00* (2006.01)
*H05K 7/14* (2006.01)

(52) U.S. Cl.
CPC ................. *H05K 7/1422* (2013.01)

(58) Field of Classification Search
CPC .................................................. H05K 7/1422
See application file for complete search history.

(56) References Cited

U.S. PATENT DOCUMENTS 9,204,543 B2    12/2015  Ossimitz
9,560,742 B2    1/2017   Brown et al.
(Continued)

FOREIGN PATENT DOCUMENTS

CN    104113983 A    10/2014
CN    104681518 A    6/2015
(Continued)

*Primary Examiner* — Pete T Lee
(74) *Attorney, Agent, or Firm* — WOMBLE BOND DICKINSON (US) LLP

(57) ABSTRACT

Embodiments of this application provide a circuit board assembly and an electronic device. The circuit board assembly includes at least a frame plate, circuit boards, support bodies, and solder joints. The frame plate includes a frame body and first pads provided on the frame body. The circuit boards each are provided on one side of the frame plate. The circuit board includes a board body and second pads provided on the board body. The support bodies are provided between the frame plate and the circuit boards. The support bodies each include a first support portion and a second support portion. The first support portion is connected to the frame body. The second support portion is connected to the board body. Solder joints are provided between the first pads and the second pads. The solder joints connect the first pads to the second pads.

19 Claims, 9 Drawing Sheets

(56) References Cited

U.S. PATENT DOCUMENTS

| | | | | |
|---|---|---|---|---|
| 2007/0200468 A1* | 8/2007 | Heim | .................. | F04B 43/0054 |
| | | | | 310/800 |
| 2008/0218823 A1* | 9/2008 | Mizoguchi | ............. | H02K 33/16 |
| | | | | 359/198.1 |
| 2009/0097256 A1* | 4/2009 | Takahashi | ............. | H01J 61/305 |
| | | | | 313/567 |

FOREIGN PATENT DOCUMENTS

| | | |
|---|---|---|
| CN | 105491818 A | 4/2016 |
| CN | 107113959 A | 8/2017 |
| CN | 108235832 A | 6/2018 |
| CN | 207720522 U | 8/2018 |
| CN | 110191579 A | 8/2019 |
| CN | 110337178 A | 10/2019 |
| CN | 110519919 A | 11/2019 |
| CN | 210008007 U | 1/2020 |
| CN | 111010798 A | 4/2020 |
| CN | 210670769 U | 6/2020 |
| CN | 211210039 U | 8/2020 |
| CN | 111698827 A | 9/2020 |
| CN | 112243314 A | 1/2021 |
| CN | 212324455 U | 1/2021 |
| CN | 212463649 U | 2/2021 |
| CN | 112437979 A | 3/2021 |
| CN | 212677451 U | 3/2021 |
| CN | 213694596 U | 7/2021 |
| CN | 115023033 A | 9/2022 |
| JP | 2019145763 A | 8/2019 |
| KR | 20200121519 A | 10/2020 |

* cited by examiner

CIRCUIT BOARD ASSEMBLY AND ELECTRONIC DEVICE

CROSS-REFERENCE TO RELATED APPLICATIONS

This application is a national stage of International Application No. PCT/CN2022/113347 filed on Aug. 18, 2022, which claims priority to Chinese Patent Application No. 202111113468.8 filed on Sep. 18, 2021. The disclosures of both of the aforementioned application are hereby incorporated by reference in their entireties.

TECHNICAL FIELD

Embodiments of this application relate to the field of terminal technologies, and in particular, to a circuit board assembly and an electronic device.

BACKGROUND

As electronic products develop towards the direction of high-density packaging, at present, a plurality of circuit boards are usually stacked to provide a larger arrangement space for a battery and other functional modules in the electronic devices. In the manner of stacking a plurality of circuit boards, electronic components may be scattered on the circuit boards. In this way, all the electronic components can be arranged without increasing areas of the circuit boards that bear the electronic components.

In the manner of stacking a plurality of circuit boards, two adjacent circuit boards are connected by using a frame plate. The frame plate and the circuit boards are assembled to form a circuit board assembly. Different circuit boards may be electrically connected to each other by using a frame plate to implement data information exchange. The circuit boards may be electrically connected to the frame plate by using solder joints. In addition, the solder joints also play a function of mechanical connection and fastening, to provide connection forces between the circuit boards and the frame plate. However, in a scenario with an uneven force, such as a drop or a collision, a connection joint at which the circuit board and the frame plate are connected by using solder joints is prone to a facture. Consequently, the circuit board and the frame plate are separated, and the circuit board assembly malfunctions or fails.

SUMMARY

Embodiments of this application provide a circuit board assembly and an electronic device, which can ensure that a large solder joint is formed between two connected pads. This is conducive to improving connection strength between the pads.

A first aspect of this application provides a circuit board assembly. The circuit board assembly is used in an electronic device. The circuit board assembly includes at least a frame plate, circuit boards, support bodies, and solder joints. The frame plate includes a frame body and first pads. The first pads are provided on the frame body. The circuit boards each are provided on one side of the frame plate. The circuit board includes a board body and second pads. The second pads are provided on the board body. The first pads face the second pads. The support bodies are provided between the frame plate and the circuit boards. The support bodies are configured to support the circuit boards, so that a predetermined spacing exists between the first pads and the second pads. The support bodies each include a first support portion and a second support portion. The first support portion and the second support portion are stacked along a thickness direction of the frame plate. The first support portion is connected to the frame body. The second support portion is connected to the board body. Solder joints are provided between the first pads and the second pads. The solder joints connect the first pads to the second pads.

According to the circuit board assembly in this embodiment of this application, in a process of connecting the circuit boards to the frame plate, solder paste is printed on the first pads on the frame plate in advance, and then the circuit boards each are placed on one side of the frame plate. Each of the circuit boards is supported by the support bodies, so that the predetermined spacing can be maintained between the second pads on the circuit board and the first pads on the frame plate. After the solder paste is melted, the circuit board is limited by the support bodies. Therefore, the circuit board does not move close to the frame plate under the action of its own gravity, so that the predetermined spacing can still be maintained between the first pads and the second pads. The first pads and the second pads do not squeeze the molten solder paste, and therefore the molten solder paste does not easily overflow from a space between the first pads and the second pads. The molten solder paste forms the solder joints after being cured. Because the solder joints are large in size, a connection force between the first pads and the solder joints and a connection force between the second pads and the solder joints are large. This effectively reduces a possibility of separation between the first pads and the solder joints or between the second pads and the solder joints in a scenario with an uneven force, such as a drop or a collision. In addition, the molten solder paste does not easily overflow from the space between the first pads and the second pads. This can also effectively reduce a possibility that a short circuit occurs between two first pads or two second pads due to solder paste flowing between the two first pads or the two second pads. This is conducive to increasing a yield of the circuit board assembly.

In a possible implementation, the frame body is an annular structure. Two or more support bodies are spaced along a circumferential direction of the frame body. Supporting each of the circuit boards by a plurality of support bodies is conducive to ensuring that a uniform spacing is maintained between the second pads provided at different locations on the circuit board and the first pads on the frame plate.

In a possible implementation, two or more support bodies are evenly distributed along the circumferential direction of the frame body. A support force applied by each support body to the circuit board is more balanced and uniform. This reduces a possibility that the circuit board inclines when being subject to an unbalanced support force, and is conducive to ensuring that the spacing between the first pads on the frame plate and the second pads on the circuit board tends to be uniform.

In a possible implementation, both the first support portion and the second support portion are solder resist layers. When the solder paste is heated and melted, the first support portion and the second support portion are not easily melted. This reduces a possibility that the circuit board moves close to the frame plate because the first support portion and the second support portion are melted and lose their support functions.

In a possible implementation, both the first support portion and the second support portion are first solder resist ink layers.

In a possible implementation, the first support portion has a uniform thickness, and the second support portion has a uniform thickness. This facilitates printing of the first solder resist ink layer with the uniform thickness on the frame body or the board body by using a printing process, thereby reducing difficulty in manufacturing the first support portion and the second support portion.

In a possible implementation, the thickness of the first support portion is equal to the thickness of the second support portion. This facilitates printing and forming of the first solder resist ink layer with the same thickness on the frame body or the board body by using a printed board with a same thickness, thereby reducing an operation of replacing the printed board, and reducing production difficulty and production costs.

In a possible implementation, the support body further includes a third support portion and a fourth support portion. The first support portion, the second support portion, the third support portion, and the fourth support portion are stacked. The third support portion is provided on a surface of the first support portion that faces the second support portion, and the fourth support portion is provided on a surface of the second support portion that faces the first support portion. By controlling thicknesses of the third support portion and the fourth support portion, the spacing between the first pads and the second pads can be adjusted to improve application flexibility of the support bodies, and the spacing between the first pads and the second pads can be accurately adjusted and controlled.

In a possible implementation, both the third support portion and the fourth support portion are solder resist layers. When the solder paste is heated and melted, the third support portion and the fourth support portion are not easily melted. This reduces a possibility that the circuit board moves close to the frame plate because the third support portion and the fourth support portion are melted and lose their support functions.

In a possible implementation, both the third support portion and the fourth support portion are second solder resist ink layers.

In a possible implementation, both the third support portion and the fourth support portion are insulating sheets.

In a possible implementation, a sum of thicknesses of the first support portion and the third support portion is equal to a sum of thicknesses of the second support portion and the fourth support portion.

In a possible implementation, the third support portion has a uniform thickness, and the fourth support portion has a uniform thickness. This can facilitate printing of the second solder resist ink layer with the uniform thickness on the frame body or the board body by using a printing process to form the third support portion or the fourth support portion, thereby reducing difficulty in manufacturing the third support portion and the fourth support portion. Alternatively, insulating sheets with a predetermined thickness are pre-processed and pre-manufactured by finish machining.

In a possible implementation, the thickness of the third support portion is equal to the thickness of the fourth support portion. This facilitates printing and forming of the second solder resist ink layer on the frame body or the board body by using a printed board with a same thickness, or insulating sheets with a predetermined thickness can be pre-processed and pre-manufactured by finish machining, thereby reducing a possibility of complex processing operations and high production costs caused by a need of processing insulating sheets with two different thicknesses to form the third support portion and the fourth support portion.

In a possible implementation, the frame plate further includes third pads. The third pads are provided on the frame body. The third pads each are covered by the first support portion. The third pads can play a function of positioning references, to help quickly and accurately provide the first support portions at predetermined locations of the frame body. This ensures that the first support portions are located at the predetermined locations, reduces a possibility that support areas between the first support portions and the second support portions become smaller due to misalignment with the second support portions that is resulted from deviation of the first support portions from the predetermined locations, and is also conducive to reducing production difficulty and improving production efficiency. The circuit board further includes fourth pads. The third pads face the fourth pads. The fourth pads each are covered by the second support portion. The fourth pads can play a function of positioning references, to help quickly and accurately provide the second support portions at predetermined locations of the board body. This ensures that the second support portions are located at the predetermined locations, reduces a possibility that support areas between the first support portions and the second support portions become smaller due to misalignment with the first support portions that is resulted from deviation of the second support portions from the predetermined locations, and is also conducive to reducing production difficulty and improving production efficiency.

In a possible implementation, a surface of the first pad that faces the second pad is flush with a surface of the third pad that faces the fourth pad, and a surface of the second pad that faces the first pad is flush with a surface of the fourth pad that faces the third pad. The spacing between the first pads and the second pads can be accurately controlled by controlling the thicknesses of the first support portions and the second support portions.

A second aspect of the embodiments of this application provides an electronic device, including the circuit board assembly described above.

The circuit board assembly includes at least a frame plate, circuit boards, support bodies, and solder joints. The frame plate includes a frame body and first pads. The first pads are provided on the frame body. The circuit boards each are provided on one side of the frame plate. The circuit board includes a board body and second pads. The second pads are provided on the board body. The first pads face the second pads. The support bodies are provided between the frame plate and the circuit boards. The support bodies are configured to support the circuit boards, so that a predetermined spacing exists between the first pads and the second pads. The support bodies each include a first support portion and a second support portion. The first support portion and the second support portion are stacked along a thickness direction of the frame plate. The first support portion is connected to the frame body. The second support portion is connected to the board body. Solder joints are provided between the first pads and the second pads. The solder joints connect the first pads to the second pads.

In a possible implementation, the frame body is an annular structure. Two or more support bodies are spaced along a circumferential direction of the frame body. Supporting each of the circuit boards by a plurality of support bodies is conducive to ensuring that a uniform spacing is maintained between the second pads provided at different locations on the circuit board and the first pads on the frame plate.

In a possible implementation, two or more support bodies are evenly distributed along the circumferential direction of the frame body. A support force applied by each support body to the circuit board is more balanced and uniform. This reduces a possibility that the circuit board inclines when being subject to an unbalanced support force, and is conducive to ensuring that the spacing between the first pads on the frame plate and the second pads on the circuit board tends to be uniform.

In a possible implementation, both the first support portion and the second support portion are solder resist layers. When the solder paste is heated and melted, the first support portion and the second support portion are not easily melted. This reduces a possibility that the circuit board moves close to the frame plate because the first support portion and the second support portion are melted and lose their support functions.

In a possible implementation, both the first support portion and the second support portion are first solder resist ink layers.

In a possible implementation, the first support portion has a uniform thickness, and the second support portion has a uniform thickness. This facilitates printing of the first solder resist ink layer with the uniform thickness on the frame body or the board body by using a printing process, thereby reducing difficulty in manufacturing the first support portion and the second support portion.

In a possible implementation, the thickness of the first support portion is equal to the thickness of the second support portion. This facilitates printing and forming of the first solder resist ink layer with the same thickness on the frame body or the board body by using a printed board with a same thickness, thereby reducing an operation of replacing the printed board, and reducing production difficulty and production costs.

In a possible implementation, the support body further includes a third support portion and a fourth support portion. The first support portion, the second support portion, the third support portion, and the fourth support portion are stacked. The third support portion is provided on a surface of the first support portion that faces the second support portion, and the fourth support portion is provided on a surface of the second support portion that faces the first support portion. By controlling thicknesses of the third support portion and the fourth support portion, the spacing between the first pads and the second pads can be adjusted to improve application flexibility of the support bodies, and the spacing between the first pads and the second pads can be accurately adjusted and controlled.

In a possible implementation, both the third support portion and the fourth support portion are solder resist layers. When the solder paste is heated and melted, the third support portion and the fourth support portion are not easily melted. This reduces a possibility that the circuit board moves close to the frame plate because the third support portion and the fourth support portion are melted and lose their support functions.

In a possible implementation, both the third support portion and the fourth support portion are second solder resist ink layers.

In a possible implementation, both the third support portion and the fourth support portion are insulating sheets.

In a possible implementation, a sum of thicknesses of the first support portion and the third support portion is equal to a sum of thicknesses of the second support portion and the fourth support portion.

In a possible implementation, the third support portion has a uniform thickness, and the fourth support portion has a uniform thickness. This can facilitate printing of the second solder resist ink layer with the uniform thickness on the frame body or the board body by using a printing process to form the third support portion or the fourth support portion, thereby reducing difficulty in manufacturing the third support portion and the fourth support portion. Alternatively: insulating sheets with a predetermined thickness are pre-processed and pre-manufactured by finish machining.

In a possible implementation, the thickness of the third support portion is equal to the thickness of the fourth support portion. This facilitates printing and forming of the second solder resist ink layer on the frame body or the board body by using a printed board with a same thickness, or insulating sheets with a predetermined thickness can be pre-processed and pre-manufactured by finish machining, thereby reducing a possibility of complex processing operations and high production costs caused by a need of processing insulating sheets with two different thicknesses to form the third support portion and the fourth support portion.

In a possible implementation, the frame plate further includes third pads. The third pads are provided on the frame body. The third pads each are covered by the first support portion. The third pads can play a function of positioning references, to help quickly and accurately provide the first support portions at predetermined locations of the frame body. This ensures that the first support portions are located at the predetermined locations, reduces a possibility that support areas between the first support portions and the second support portions become smaller due to misalignment with the second support portions that is resulted from deviation of the first support portions from the predetermined locations, and is also conducive to reducing production difficulty and improving production efficiency. The circuit board further includes fourth pads. The third pads face the fourth pads. The fourth pads each are covered by the second support portion. The fourth pads can play a function of positioning references, to help quickly and accurately provide the second support portions at predetermined locations of the board body. This ensures that the second support portions are located at the predetermined locations, reduces a possibility that support areas between the first support portions and the second support portions become smaller due to misalignment with the first support portions that is resulted from deviation of the second support portions from the predetermined locations, and is also conducive to reducing production difficulty and improving production efficiency.

In a possible implementation, a surface of the first pad that faces the second pad is flush with a surface of the third pad that faces the fourth pad, and a surface of the second pad that faces the first pad is flush with a surface of the fourth pad that faces the third pad. The spacing between the first pads and the second pads can be accurately controlled by controlling the thicknesses of the first support portions and the second support portions.

DESCRIPTION OF REFERENCE NUMERALS

10: electronic device;
20: display assembly;
30: middle frame;
40: circuit board assembly;
41: circuit board; 411: board body; 412: second pad; and 413: fourth pad;
42: frame plate; 42a: intermediate accommodating hole; 421: frame body; 422: first pad; and 423: third pad;
43: support body; 431: first support portion; 432: second support portion; 433: third support portion; and 434: fourth support portion;
50: rear cover;
60: electronic component;
70: solder joint; and
X: thickness direction.

DESCRIPTION OF EMBODIMENTS

Figure 1:
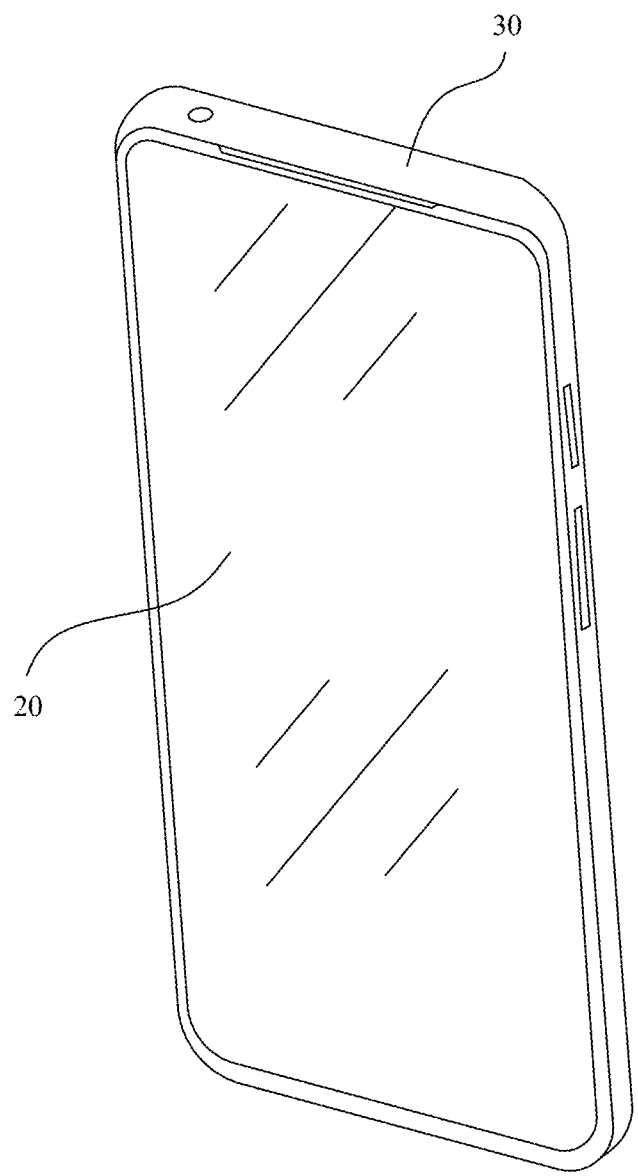
FIG. 1 is a schematic diagram of a structure of an electronic device according to an embodiment of this application.

FIG. 1 schematically shows a structure of an electronic device 10 according to an embodiment. As shown in FIG. 1, an embodiment of this application provides the electronic device 10. The electronic device 10 may be a mobile terminal, a fixed terminal, or a foldable device, such as a monitor, a handheld wireless communication device, a desktop computer, a laptop (laptop) computer, a tablet (Tablet) computer, an ultra-mobile personal computer (UMPC), a handheld computer, a walkie-talkie, a netbook, a POS machine, or a personal digital assistant (personal digital assistant, PDA).

For ease of description, an example in which the electronic device 10 is a handheld wireless communication device is used for description in all of the following embodiments. The handheld wireless communication device may be a mobile phone.

Figure 2:
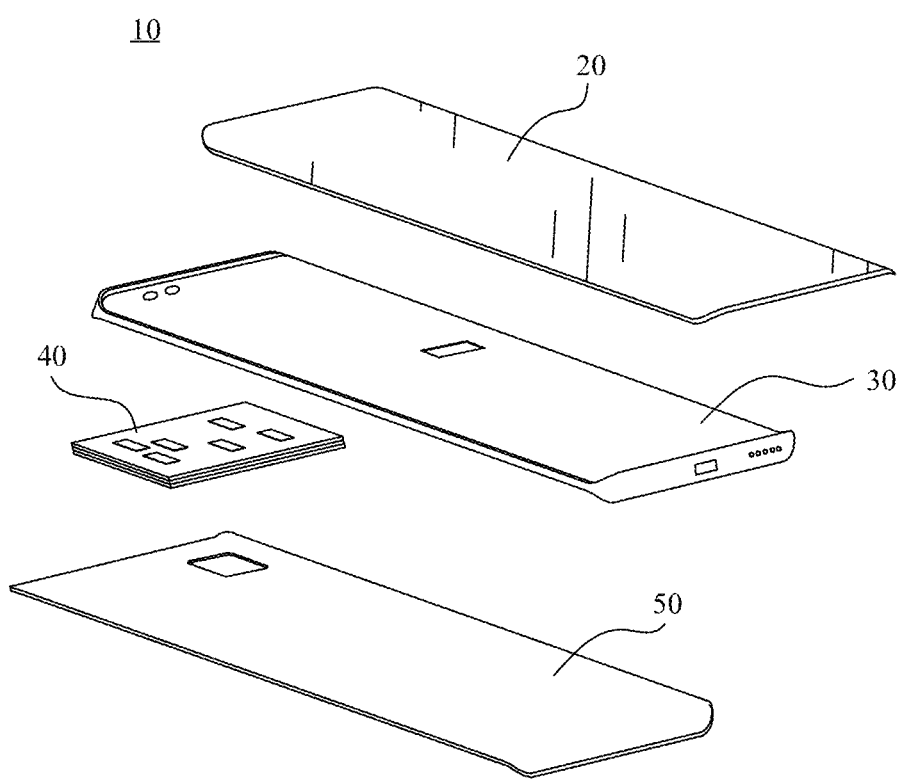
FIG. 2 is a schematic diagram of a breakdown structure of an electronic device according to an embodiment of this application.

FIG. 2 schematically shows a breakdown structure of the electronic device 10 according to an embodiment. As shown in FIG. 2, the electronic device 10 includes a display assembly 20, a middle frame 30, a circuit board assembly 40, and a rear cover 50. The display assembly 20 has a display region for displaying image information. The display region faces away from the middle frame 30. In a power-on state, the display region can display corresponding image information. The middle frame 30 is provided between the display assembly 20 and the rear cover 50 along a thickness direction of the electronic device 10. It should be noted that, the thickness direction of the electronic device 10 refers to an arrangement direction of the display assembly 20 and the rear cover 50. The circuit board assembly 40 is provided in a space formed between the middle frame 30 and the rear cover 50. The circuit board assembly 40 may be provided on a surface of the middle frame 30 that faces the rear cover 50.

The circuit board assembly 40 may include circuit boards 41 and a plurality of electronic components 60 electrically connected to the circuit boards 41.

The circuit board 41 in this application may be a printed circuit board (Printed Circuit Board. PCB), a flexible printed circuit (Flexible Printed Circuit. FPC), or an integrated circuit (or referred to as a chip). The circuit board 41 may be a single-sided board or double-sided board. "Single-sided board" means that the electronic components 60 are provided on one side of the circuit board 41. "Double-sided board" means that the electronic components 60 are provided on both sides of the circuit board 41. The circuit board 41 may be a radio frequency (radio frequency. RF) board or an application processor (application processor. AP) board. The radio frequency board may be configured to bear a radio frequency integrated circuit (radio frequency integrated circuit. RFIC), a radio frequency power amplifier (radio frequency power amplifier, RFPA), a wireless fidelity (wireless fidelity. Wi-Fi) chip, and the like, but is not limited thereto. For example, the application processor board may be configured to bear a system on chip (system on chip, SOC) element, a double data rate (double data rate. DDR) memory: a primary power management unit (power management unit, PMU), a secondary power management unit, and the like, but is not limited thereto.

For example, when a thickness of the electronic device 10 is small but the display assembly 20 is large, the circuit board 41 may have a large lateral size, so that one circuit board 41 may be selected for use and a fixed quantity of electronic components 60 may be provided on the circuit board 41. The lateral size refers to a size measured along a direction perpendicular to the thickness direction of the electronic device 10. If the quantity and volumes of the electronic components 60) are large, a structure of the circuit board assembly 40 needs to be optimized when not all of the electronic components 60 can be accommodated on one circuit board 41. For example, a plurality of the circuit boards 41 are stacked along the thickness direction of the electronic device 10, and the electronic components 60 are provided on different circuit boards 41. In this way, an internal space of the electronic device 10 can be fully utilized along the thickness direction of the electronic device 10 to accommodate more and larger electronic components 60.

Figure 3:
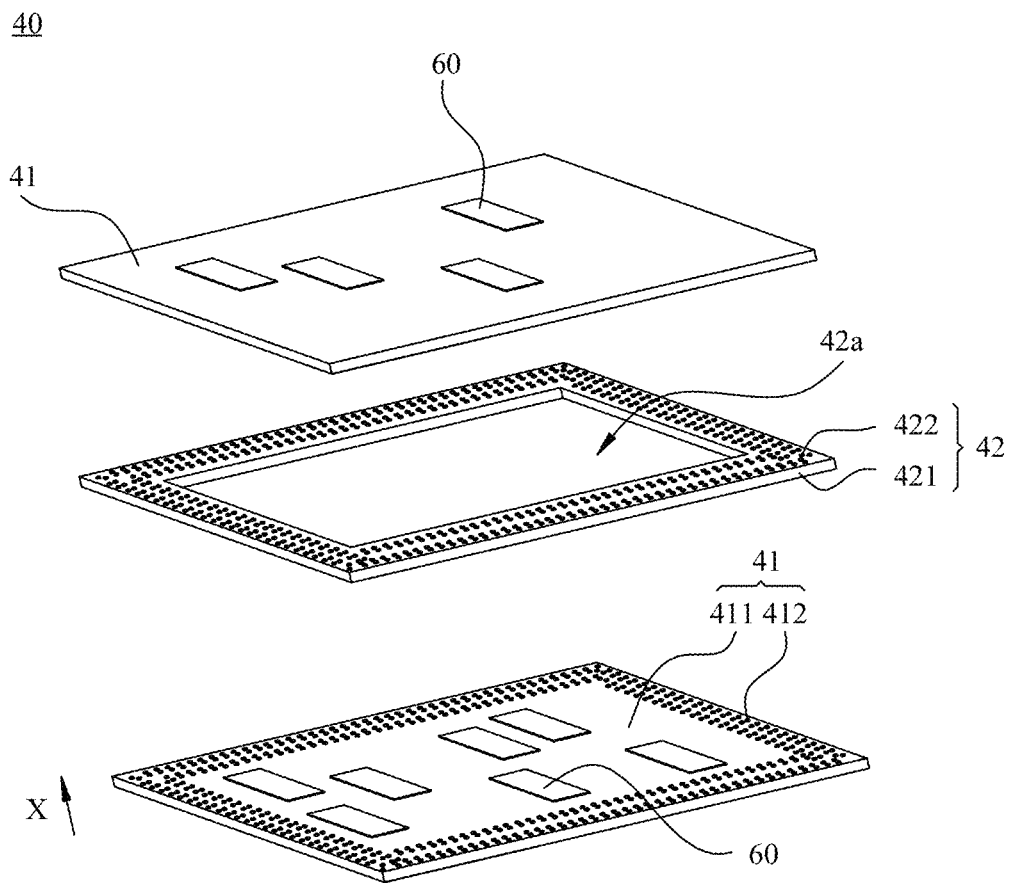
FIG. 3 is a schematic diagram of a breakdown structure of a circuit board assembly according to a related technology.
Figure 4:
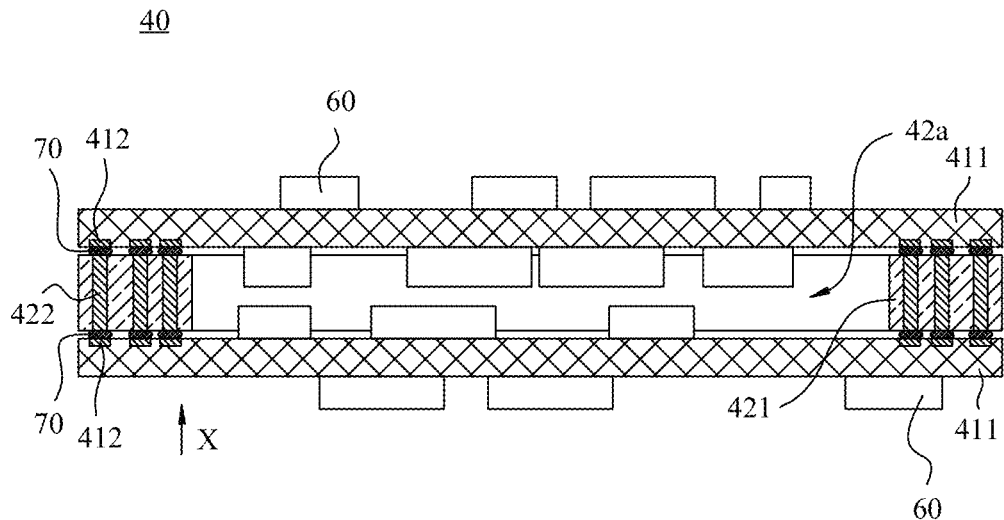
FIG. 4 is a schematic diagram of a partial cross-sectional structure of the circuit board assembly in the embodiment shown in FIG. 3.

FIG. 3 schematically shows a breakdown structure of the circuit board assembly 40 in a related technology. FIG. 4 schematically shows a partial cross-sectional structure of the circuit board assembly 40 shown in FIG. 3. As shown in FIG. 3 and FIG. 4, in the related technology, the circuit board assembly 40 includes the circuit boards 41 and a frame plate 42. Two circuit boards 41 and the frame plate 42 are stacked along a thickness direction X of the frame plate 42.

The frame plate 42 is provided between the two circuit boards 41. The two circuit boards 41 are separately connected to the frame plate 42, so that a predetermined distance is maintained between the two circuit boards 41 and locations of the two circuit boards 41 do not interfere with each other. The two circuit boards 41 may also be electrically connected to each other by using the frame plate 42, so that data information can be mutually transmitted between the two circuit boards 41. The frame plate 42 has an annular structure as a whole, so that the frame plate 42 includes a middle accommodating hole 42a. For example, the frame plate 42 may have a polygonal structure, such as a rectangular structure. After the two circuit boards 41 are connected to the frame plate 42, the electronic components 60 on the two circuit boards 41 may be located in the middle accommodating hole 42a, to avoid locations of the frame plate 42 and the electronic components 60 from interfering with each other. A thickness of the frame plate 42 needs to ensure that the electronic components 60 that are located in the middle accommodating hole 42a and that are located on the two circuit boards 41 do not reach contact with each other.

The frame plate 42 includes a frame body 421 and first pads 422. The frame body 421 is an annular structure. The frame body 421 has the intermediate accommodating hole 42a. The first pads 422 are provided on the frame body 421. For example, a material of the first pads 422 may be copper or a copper alloy. The circuit board 41 includes a board body 411 and second pads 412. The second pads 412 are provided on the board body 411. The first pads 422 face the second pads 412, so that locations of the first pads 422 mutually correspond to locations of the second pads 412. Solder joints are located between the first pads 422 and the second pads 412. The solder joints connect the first pads 422 to the second pads 412. A shape of the solder joint may be but is not limited to a spherical shape, an ellipsoidal shape, a cylindrical shape, or a truncated-cone shape. The first pads 422 include functional pads and non-functional pads. The functional pads can play an electrical connection function and a mechanical fastening function. After the two circuit boards 41 are connected to the frame plate 42, the two circuit boards 41 can transmit electrical signals to each other by using the functional pads. The non-functional pads can play a mechanical fastening function, but the two circuit boards 41 cannot transmit electrical signals to each other by using the non-functional pads.

When the circuit boards 41 need to be connected to the frame plate 42, solder paste is printed on the first pads 422 in advance. The solder paste may include tin and a solder flux. Then, the circuit boards 41 each are provided on one side of the frame plate 42 and made to reach contact with the solder paste. The solder paste is heated and melted, so that the first pads 422 and the second pads 412 are all connected to the molten solder paste. After the molten solder paste is cured, solder joints 70 are formed, so that the circuit boards 41 are connected to the frame plate 42 by using the solder joints 70.

The molten solder paste heated has fluidity. As the circuit board 41 and the frame plate 42 each have specific mass, after the solder paste is melted, the circuit board 41 moves close to the frame plate 42 under the action of its own gravity. Therefore, a spacing between the first pads 422 of the frame plate 42 and the second pads 412 of the circuit board 41 is reduced, and the first pads 422 and the second pads 412 squeeze the molten solder paste. As a result, the solder paste is squeezed, and a remaining amount of the solder paste is small. When remaining solder paste between the first pads 422 and the second pads 412 is little, the solder joints 70 formed after the solder paste is cured are small in size. Consequently, a connection force between the first pads 422 and the solder joints 70 and a connection force between the second pads 412 and the solder joints 70) are small. It should be noted that, the connection force refers to a force that needs to be overcome for the pads to be separated from the solder joints. The force required for separating the pads from the solder joints refers to a tensile stress, along a direction away from the solder joints, that is applied to the pads along the thickness direction X and that is required for separating the pads from the solder joints. Therefore, in a scenario with an uneven force, such as a drop or a collision, a connection joint at which the circuit board 41 and the frame plate 42 are connected by using the solder joints 70 is prone to a facture. Consequently, the circuit board 41 and the frame plate 42 are separated, and the circuit board assembly 40 malfunctions or fails. In addition, the solder paste that overflows from between the first pads 422 and the second pads 412 flows between two adjacent first pads 422 or between two adjacent second pads 412. This leads to a short circuit between the two first pads 422 or between the two second pads 412, thereby causing the circuit board assembly 40 to be scrapped.

The following further describes an implementation of the circuit board assembly 40 provided in this embodiment of this application.

Figure 5:
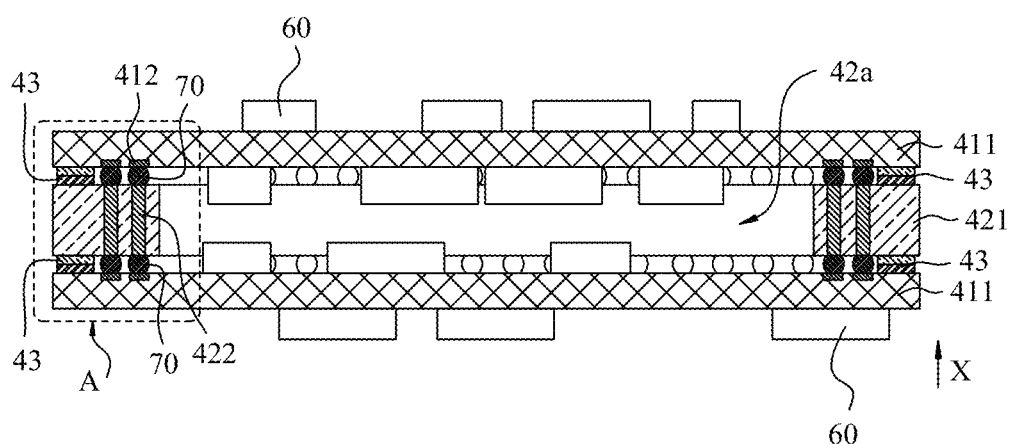
FIG. 5 is a schematic diagram of a partial cross-sectional structure of a circuit board assembly according to an embodiment of this application.
Figure 6:
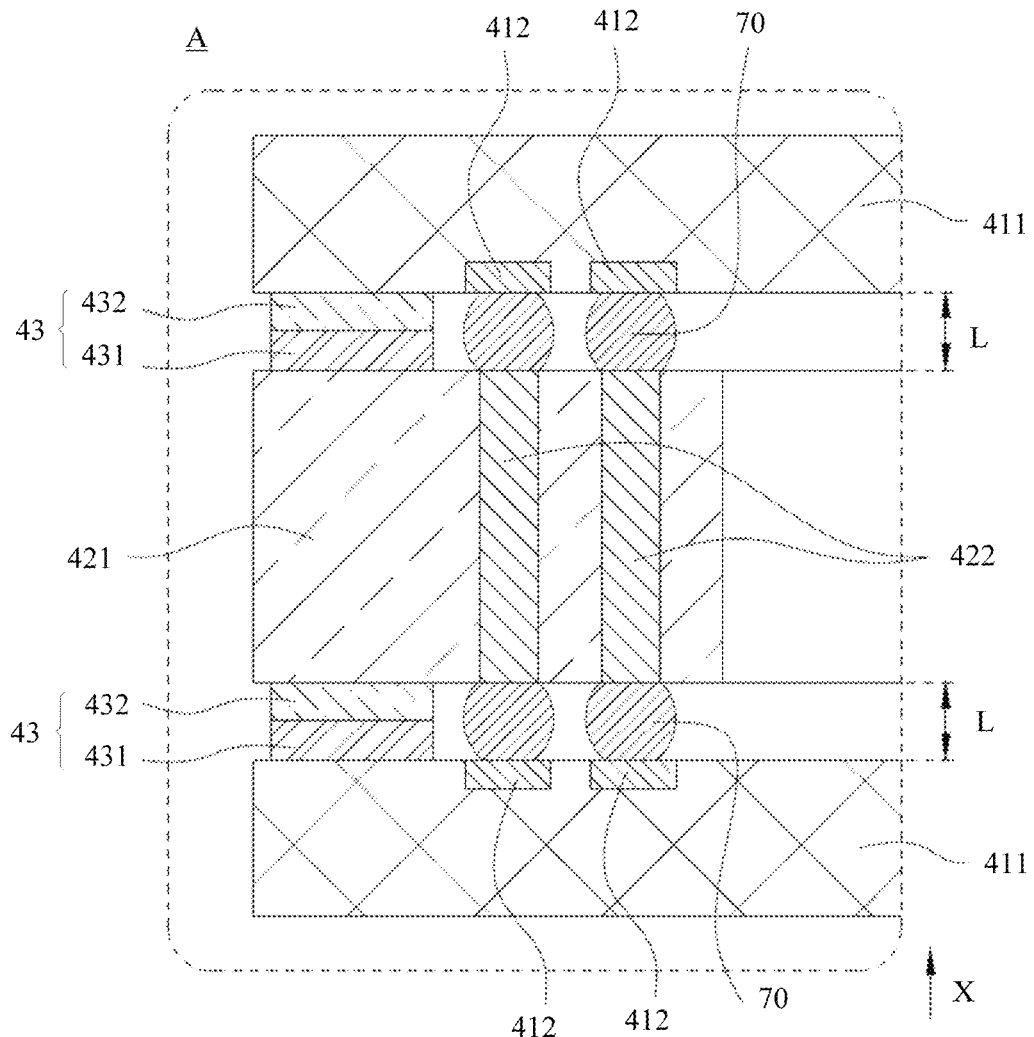
FIG. 6 is an enlarged view of a location A in FIG. 5.

FIG. 5 schematically shows a partial cross-sectional structure of the circuit board assembly 40 according to an embodiment of this application. As shown in FIG. 5 and FIG. 6, the circuit board assembly 40 in this embodiment of this application is used in the electronic device 10. The circuit board assembly 40 includes circuit boards 41, a frame plate 42, support bodies 43, and solder joints 70. The frame plate 42 includes a frame body 421 and first pads 422.

For example, the frame body 421 is an annular structure, and therefore forms an intermediate accommodating hole 42a.

For example, a material of the frame body 421 is an insulating material such as phenolic resin, epoxy resin, or polytetrafluoroethylene. The first pads 422 are provided on the frame body 421. The circuit boards 41 each are provided on one side of the frame plate 42. The circuit board 41 includes a board body 411 and second pads 412.

For example, a material of the board body 411 is an insulating material such as phenolic resin, epoxy resin, or polytetrafluoroethylene. Electronic components may be provided on the board body 411. The second pads 412 are provided on the board body 411, and the first pads 422 face the second pads 412. A quantity of the first pads 422 may be equal to a quantity of the second pads 412.

According to the circuit board assembly 40 in this embodiment of this application, the support bodies 43 are provided between the circuit boards 41 and the frame plate 42, so that a predetermined spacing L exists between the first pads 422 and the second pads 412. This reduces a possibility that solder paste overflows from between the first pads 422 and the second pads 412 because the first pads 422 and the second pads 412 excessively squeeze the molten solder paste, and is conducive to ensuring that the molten solder paste is located between the first pads 422 and the second pads 412. Therefore, the solder joints 70 formed after the solder paste is cured are large in size, and a connection force between the first pads 422 and the solder joints 70 and a connection force between the second pads 412 and the solder joints 70 are effectively increased. This reduces a possibility that a connection joint at which the circuit board 41 and the frame plate 42 are connected by using the solder joints 70 is prone to a fracture in a scenario with an uneven force, such as a drop or a collision.

It should be noted that, that a predetermined spacing L exists between the first pads 422 and the second pads 412 means that the spacing between the first pads 422 and the second pads 412 can allow a proper solder paste melting space to be formed between the first pads 422 and the second pads 412, so as to ensure that the first pads 422 and the second pads 412 are both in contact with the solder paste, without squeezing the solder paste out from between the first pads 422 and the second pads 412.

Figure 7:
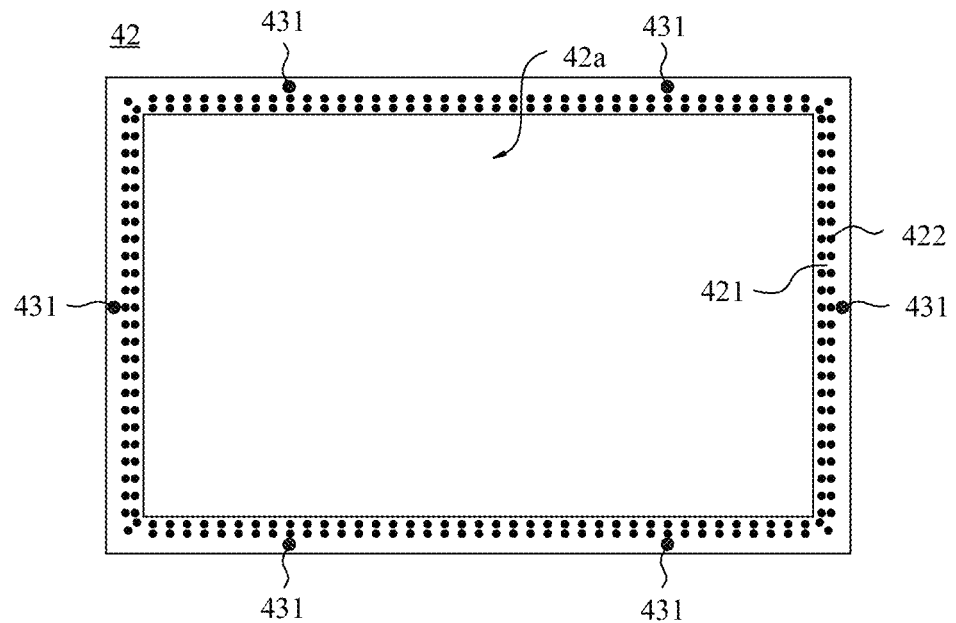
FIG. 7 is a schematic diagram of a top-view structure of a frame plate according to an embodiment of this application.

FIG. 7 schematically shows a top-view structure of the frame plate 42 according to an embodiment of this application. Referring to FIG. 6 and FIG. 7, the support bodies 43 are provided between the frame plate 42 and the circuit boards 41. The support bodies 43 are configured to support the circuit boards 41, so that the predetermined spacing L exists between the first pads 422 and the second pads 412. The support bodies 43 each include a first support portion 431 and a second support portion 432. The first support portion 431 and the second support portion 432 are stacked along a thickness direction X of the frame plate 42. The first support portion 431 is connected to the frame body 421, and the second support portion 432 is connected to the board body 411 of the circuit board 41. The first support portion 431 and the second support portion 432 are separately provided. The stacked first support portion 431 and second support portion 432 can support the circuit board 41. The solder joints 70 are provided between the first pads 422 and the second pads 412. The solder joints 70 connect the first pads 422 to the second pads 412.

According to the circuit board assembly 40 in this embodiment of this application, in a process of connecting the circuit boards 41 to the frame plate 42, the solder paste is printed on the first pads 422 on the frame plate 42 in advance, and then the circuit boards 41 each are placed on one side of the frame plate 42. Each of the circuit boards 41 is supported by the support bodies 43, so that the predetermined spacing L can be maintained between the second pads 412 on the circuit board 41 and the first pads 422 on the frame plate 42. After the solder paste is melted, the circuit board 41 is limited by the support bodies 43. Therefore, the circuit board 41 does not move close to the frame plate 42 under the action of its own gravity, so that the predetermined spacing L can still be maintained between the first pads 422 and the second pads 412. The first pads 422 and the second pads 412 do not squeeze the molten solder paste, and therefore the molten solder paste does not easily overflow from the space between the first pads 422 and the second pads 412. The molten solder paste forms the solder joints 70 after being cured. Because the solder joints 70 are large in size, the connection force between the first pads 422 and the solder joints 70 and the connection force between the second pads 412 and the solder joints 70 are large. This effectively reduces a possibility of separation between the first pads 422 and the solder joints 70 or between the second pads 412 and the solder joints 70 in a scenario with an uneven force, for example, the circuit board assembly 40 drops or collides. In addition, the molten solder paste does not easily overflow from the space between the first pads 422 and the second pads 412. This can also effectively reduce a possibility that a short circuit occurs between two first pads 422 or two second pads 412 due to solder paste flowing between the two first pads 422 or the two second pads 412. This is conducive to increasing a yield of the circuit board assembly 40.

In some feasible implementations, a surface of the first support portion 431 that faces the second support portion 432 and a surface of the second support portion 432 that faces the first support portion 431 come into contact with each other. Before the circuit board 41 is connected to the frame plate 42, the first support portion 431 may be connected to the frame body 421 in advance, and the second support portion 432 may be connected to the board body 411 of the circuit board 41 in advance. After the solder paste is printed on the first pads 422, the circuit board 41 is placed on one side of the frame plate 42, and the second support portion 432 on the board body 411 of the circuit board 41 is made corresponding to the first support portion 431 on the frame body 421, and the first pads 422 are made corresponding to the second pads 412. The first support portion 431 abuts against the second support portion 432, so that the first support portion 431 and the second support portion 432 play a supporting function.

As shown in FIG. 7, two or more support bodies 43 are spaced along a circumferential direction of the frame body 421. It should be noted that the circumferential direction of the frame body 421 refers to a direction around the middle accommodating hole 42a. The two or more support bodies 43 can support the circuit board 41 at different locations. A plurality of first pads 422 and an equal quantity of corresponding second pads 412 may be provided between two adjacent support bodies 43. Supporting each of the circuit boards 41 by a plurality of support bodies 43 is conducive to ensuring that a uniform spacing is maintained between the second pads 412 provided at different locations on the circuit board 41 and the first pads 422 on the frame plate 42. This is conducive to ensuring consistency of sizes and dimensions of the solder joints 70 formed between the frame plate 42 and different regions of the circuit board 41.

Figure 8A:
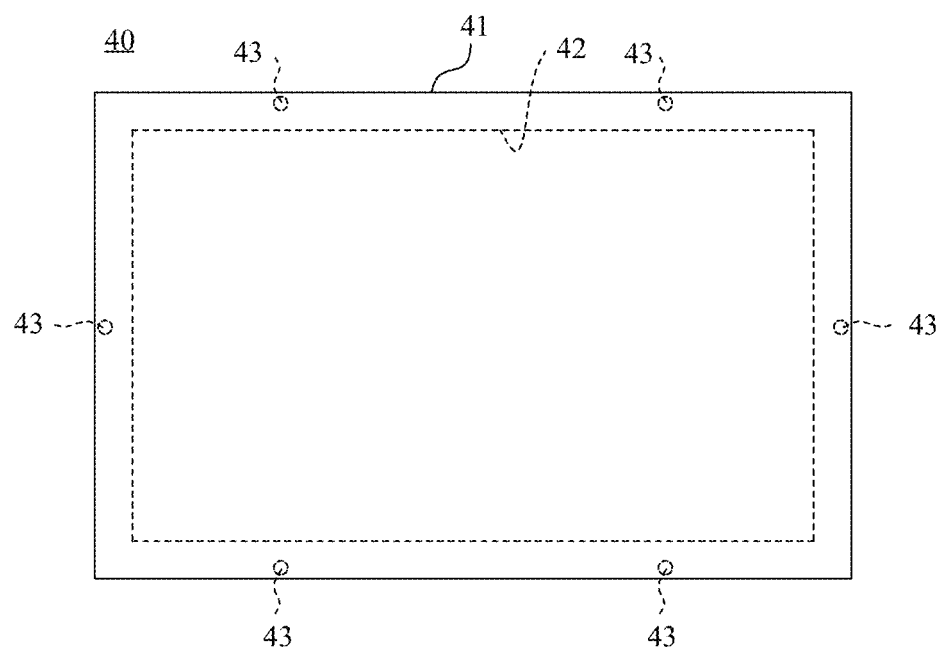
FIG. 8a is a schematic diagram of a top-view structure of a circuit board assembly according to an embodiment of this application.

FIG. 8a schematically shows a top-view structure of the circuit board assembly 40 according to an embodiment of this application. As shown in FIG. 8a, for example, the frame plate 42 is a rectangular structure. The support bodies 43 are respectively provided between four bezels of the frame plate 42 and the board body 411 of the circuit board 41. The frame plate 42 has bezels on long edges. Two or more support bodies 43 are provided on each of the bezels on the long edges. This helps reduce a possibility that regions of the circuit board 41 that correspond to the bezels are depressed toward the frame plate 42 under the action of their own gravity and deformed.

Figure 8B:
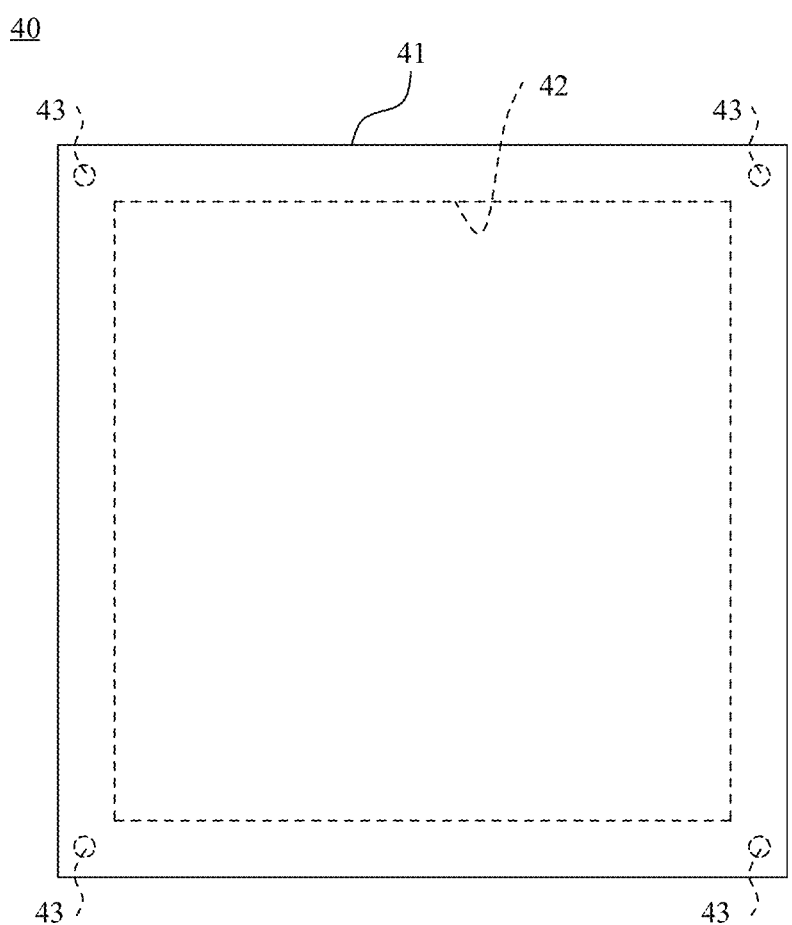
FIG. 8b is a schematic diagram of a top-view structure of a circuit board assembly according to another embodiment of this application.

FIG. 8b schematically shows a top-view structure of the circuit board assembly 40 according to another embodiment of this application. As shown in FIG. 8b, the frame plate 42 is a square structure. The support bodies 43 are respectively provided between four corner regions of the frame plate 42 and the board body 411 of the circuit board 41. This helps improve stability of locations of the frame plate 42.

In some examples, as shown in FIG. 8b, two or more support bodies 43 are evenly distributed along a circumferential direction of the frame plate 42. A spacing between every two adjacent support bodies 43 is equal. For example, the spacing between the two adjacent support bodies 43 may range from five to ten millimeters. The spacing between the two adjacent support bodies 43 may be a size measured along the bezel. Therefore, a support force applied by each support body 43 to the circuit board 41 is more balanced and uniform. This reduces a possibility that the circuit board 41 inclines when being subject to an unbalanced support force, and is conducive to ensuring that the spacing between the first pads 422 on the frame plate 42 and the second pads 412 on the circuit board 41 tends to be uniform.

Both the first support portion 431 and the second support portion 432 are solder resist layers. Both the first support portion 431 and the second support portion 432 have good heat resistance. When the solder paste is heated and melted, the first support portion 431 and the second support portion 432 are not easily melted. This reduces a possibility that the circuit board 41 moves close to the frame plate 42 because the first support portion 431 and the second support portion 432 are melted and lose their support functions. The first support portion 431 and the second support portion 432 each are insulating materials. The first support portion 431 or the second support portion 432 does not electrically connect two first pads 422 or two second pads 412 and therefore does not cause a short circuit.

In some examples, both the first support portion 431 and the second support portion 432 are first solder resist ink layers. For example, a material of the first solder resist ink layers is green ink. The first solder resist ink layer is printed on the frame body 421, and the first solder resist ink layer forms the first support portion 431 with large hardness after being cured. The first solder resist ink layer is printed on the board body 411 of the circuit board 41, and the first solder resist ink layer forms the second support portion 432 with large hardness after being cured. For example, a thickness of the first support portion 431 ranges from 15 to 20 micrometers. A thickness of the second support portion 432 ranges from 15 to 20 micrometers.

The first support portion 431 has a uniform thickness, to be specific, thicknesses of different regions of the first support portion 431 are the same. The second support portion 432 has a uniform thickness, to be specific, thicknesses of different regions of the second support portion 432 are the same. Therefore, this facilitates printing of the first solder resist ink layer with the uniform thickness on the frame body 421 or the board body 411 by using a printing process, thereby reducing difficulty in manufacturing the first support portion 431 and the second support portion 432. For example, the thickness of the first support portion 431 is equal to the thickness of the second support portion 432. This facilitates printing and forming of the green ink with the same thickness on the frame body 421 or the board body 411 by using a printed board with a same thickness, thereby reducing an operation of replacing the printed board, and reducing production difficulty and production costs.

Both the first support portion 431 and the second support portion 432 are disc-shaped structures. Cross sections of the first pads 422 and the second pads 412 may be circular.

Figure 9:
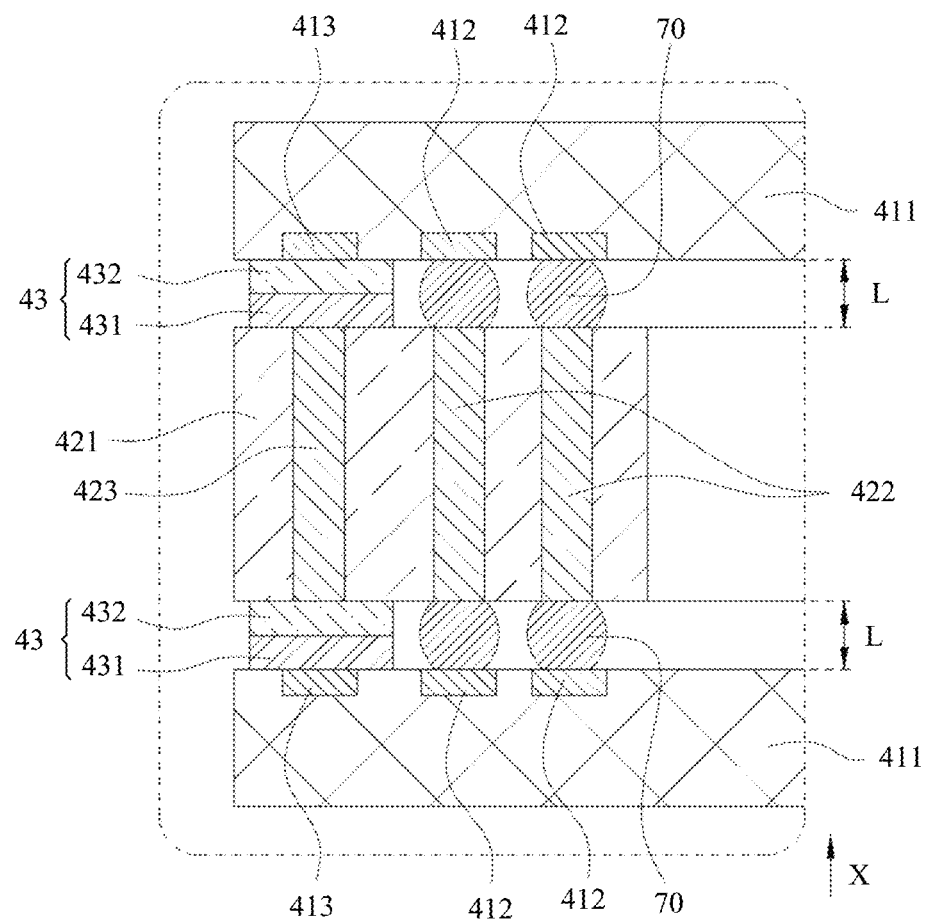
FIG. 9 is a schematic diagram of a partial cross-sectional structure of a circuit board assembly according to another embodiment of this application.

FIG. 9 schematically shows a partial cross-sectional structure of the circuit board assembly 40 according to an embodiment of this application. As shown in FIG. 9, the frame plate 42 further includes third pads 423. The third pads 423 are provided on the frame body 421. For example, a material of the third pads 423 may be copper or a copper alloy. The third pads 423 are non-functional pads. The third pads 423 each are covered by the first support portion 431. An area of the first support portion 431 may be greater than an area of the third pad 423, and the entire third pad 423 is located below the first support portion 431. Alternatively, an area of the first support portion 431 may be equal to an area of the third pad 423, and the first support portion 431 is located on one side of the third pad 423. The first pad 422 and the third pad 423 are spaced apart. The third pads 423 can play a function of positioning references, to help quickly and accurately provide the first support portions 431 at predetermined locations of the frame body 421. This ensures that the first support portions 431 are located at the predetermined locations, reduces a possibility that support areas between the first support portions 431 and the second support portions 432 become smaller due to misalignment with the second support portions 432 that is resulted from deviation of the first support portions 431 from the predetermined locations, and is also conducive to reducing production difficulty and improving production efficiency.

The circuit board 41 further includes fourth pads 413. The fourth pads 413 are provided on the board body 411. For example, a material of the fourth pads 413 may be copper or a copper alloy. The fourth pads 413 are non-functional pads. The fourth pads 413 each are covered by the second support portion 432. An area of the second support portion 432 may be greater than an area of the fourth pad 413, and the entire fourth pad 413 is located below the second support portion 432. Alternatively: an area of the second support portion 432 may be equal to an area of the fourth pad 413, and the second support portion 432 is located on one side of the fourth pad 413. The third pads 423 and the fourth pads 413 are correspondingly provided. The fourth pads 413 can play a function of positioning references, to help quickly and accurately provide the second support portions 432 at predetermined locations of the board body 411. This ensures that the second support portions 432 are located at the predetermined locations, reduces a possibility that support areas between the first support portions 431 and the second support portions 432 become smaller due to misalignment with the first support portions 431 that is resulted from deviation of the second support portions 432 from the predetermined locations, and is also conducive to reducing production difficulty and improving production efficiency.

In some implementations, a surface of the first pad 422 that faces the second pad 412 is flush with a surface of the third pad 423 that faces the fourth pad 413. In addition, a surface of the second pad 412 that faces the first pad 422 is flush with a surface of the fourth pad 413 that faces the third pad 423. In this way, a sum of thicknesses of portions, of the first support portion 431 and the second support portion 432, that are each located between the third pad 423 and the fourth pad 413 is equal to a value of the spacing between the first pads 422 and the second pads 412. The spacing between the first pads 422 and the second pads 412 can be accurately controlled by controlling the thicknesses of the first support portions 431 and the second support portions 432. For example, the surface of the first pad 422 that faces the second pad 412, the surface of the third pad 423 that faces the fourth pad 413, the surface of the second pad 412 that faces the first pad 422, and the surface of the fourth pad 413 that faces the third pad 423 are all planar surfaces.

Figure 10:
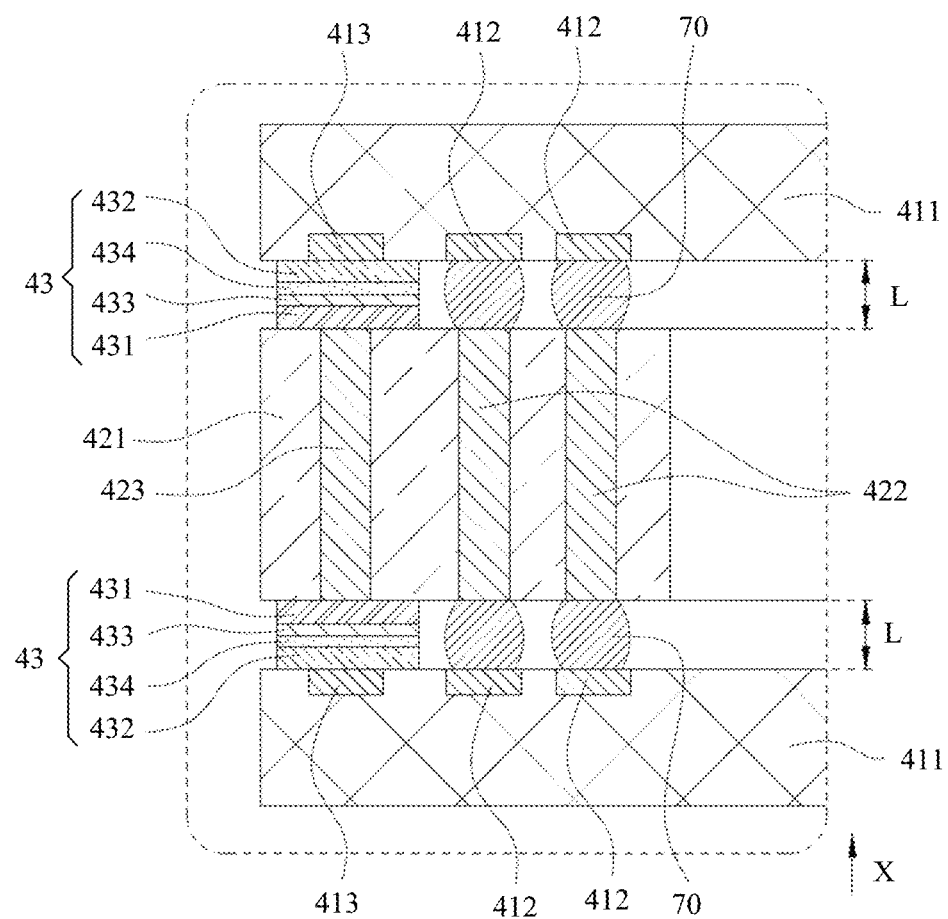
FIG. 10 is a schematic diagram of a partial cross-sectional structure of a circuit board assembly according to still another embodiment of this application.

FIG. 10 schematically shows a partial cross-sectional structure of the circuit board assembly 40 according to an embodiment of this application. As shown in FIG. 10, the support body 43 further includes a third support portion 433 and a fourth support portion 434. The first support portion 431, the second support portion 432, the third support portion 433, and the fourth support portion 434 are stacked along the thickness direction X of the frame plate 42. The third support portion 433 is provided on a surface of the first support portion 431 that faces the second support portion 432. The fourth support portion 434 is provided on a surface of the second support portion 432 that faces the first support portion 431. When a sum of the thicknesses of the first support portion 431 and the second support portion 432 cannot meet a requirement of the spacing between the first pads 422 and the second pads 412, the spacing between the first pads 422 and the second pads 412 can be further increased by using the third support portion 433 and the fourth support portion 434. Therefore, by controlling thicknesses of the third support portion 433 and the fourth support portion 434, the spacing between the first pads 422 and the second pads 412 can be adjusted to improve application flexibility of the support bodies 43, and the spacing between the first pads 422 and the second pads 412 can be accurately adjusted and controlled.

When the circuit board 41 is connected to the frame plate 42, after the solder paste is printed on the first pads 422, the circuit board 41 is placed on one side of the frame plate 42, and the fourth support portion 434 on the board body 411 of the circuit board 41 is made corresponding to the third support portion 433 on the frame body 421, and the first pads 422 are made corresponding to the second pads 412. The third support portion 433 abuts against the fourth support portion 434, so that the support body 43 plays a supporting function. The spacing between the first pads 422 and the second pads 412 is equal to a sum of the thicknesses of the first support portion 431, the second support portion 432, the third support portion 433, and the fourth support portion 434.

Both the third support portion 433 and the fourth support portion 434 are solder resist layers. Both the third support portion 433 and the fourth support portion 434 have good heat resistance. When the solder paste is heated and melted, the third support portion 433 and the fourth support portion 434 are not easily melted. This reduces a possibility that the circuit board 41 moves close to the frame plate 42 because the third support portion 433 and the fourth support portion 434 are melted and lose their support functions. The third support portion 433 and the fourth support portion 434 each are insulating materials. The third support portion 433 or the fourth support portion 434 does not electrically connect two first pads 422 or two second pads 412 and therefore does not cause a short circuit.

In some examples, both the third support portion 433 and the fourth support portion 434 are second solder resist ink layers. For example, a material of the second solder resist ink layers is white ink. The second solder resist ink layer is printed on the first support portion 431, and the second solder resist ink layer forms the third support portion 433 with large hardness after being cured. The second solder resist ink layer is printed on the second support portion 432, and the second solder resist ink layer forms the fourth support portion 434 with large hardness after being cured.

In some examples, both the third support portion 433 and the fourth support portion 434 are insulating sheets. For example, materials of the third support portion 433 and the fourth support portion 434 are both plastic, for example, polyethylene terephthalate, polyvinyl chloride, polyethylene, or polypropylene. A third support portion 433 and a fourth support portion 434 that have a predetermined length and width may be pre-processed and pre-manufactured by finish machining. Then, the third support portion 433 is provided on the first support portion 431, and the fourth support portion 434 is provided on the second support portion 432. For example, the third support portion 433 may be attached to the first support portion 431, and the fourth support portion 434 may be attached to the second support portion 432.

In some examples, the third support portion 433 is at least partially located between the third pad 423 and the fourth pad 413. The fourth support portion 434 is at least partially located between the third pad 423 and the fourth pad 413. Both the third support portion 433 and the fourth support portion 434 are disc-shaped structures. Cross sections of the third pads 423 and the fourth pads 413 may be circular.

A sum of the thicknesses of the first support portion 431 and the third support portion 433 is equal to a sum of the thicknesses of the second support portion 432 and the fourth support portion 434. For example, the first support portion 431 and the second support portion 432 have a same thickness, and the third support portion 433 and the fourth support portion 434 have a same thickness. Alternatively, the thickness of the first support portion 431 is less than the thickness of the second support portion 432, and the thickness of the third support portion 433 is greater than the thickness of the fourth support portion 434. Alternatively, the thickness of the first support portion 431 is greater than the thickness of the second support portion 432, and the thickness of the third support portion 433 is less than the thickness of the fourth support portion 434.

The third support portion 433 has a uniform thickness, and the fourth support portion 434 has a uniform thickness. This can facilitate printing of the second solder resist ink layer with the uniform thickness on the frame body 421 or the board body 411 by using a printing process to form the third support portion 433 or the fourth support portion 434, thereby reducing difficulty in manufacturing the third support portion 433 and the fourth support portion 434. Alternatively, insulating sheets with a predetermined thickness are pre-processed and pre-manufactured by finish machining.

The thickness of the third support portion 433 is equal to the thickness of the fourth support portion 434. This facilitates printing and forming of the second solder resist ink layer on the frame body 421 or the board body 411 by using a printed board with a same thickness, or insulating sheets with a predetermined thickness can be pre-processed and pre-manufactured by finish machining, thereby reducing a possibility of complex processing operations and high production costs caused by a need of processing insulating sheets with two different thicknesses to form the third support portion 433 and the fourth support portion 434.

In the description of the embodiments of this application, it should be noted that, the terms "mounting". "connection", and "connect" should be understood in a broad sense unless otherwise expressly stipulated and limited. For example, "connection" may be a fixed connection, an indirect connection through an intermediate medium, internal communication between two elements, or an interaction relationship between two elements. For a person of ordinary skill in the art, specific meanings of the foregoing terms in the embodiments of this application can be understood based on specific situations.

In the description of the embodiments of this application, it should be understood that directions or positional relationships indicated by direction-related descriptions such as "up". "down". "left", and "right" are based on directions or positional relationships shown by the accompanying drawings, which are used only for describing the embodiments of this application and for description brevity, but do not indicate or imply that an indicated apparatus or element must have a specific direction or must be constructed and operated in a specific direction. Therefore, this cannot be understood as a limitation on the embodiments of this application. In the description of the embodiments of this application. "a plurality of" means two or more, unless otherwise explicitly and specifically specified.

The terms "first". "second". "third". "fourth", and the like (if any) in this specification, the claims, and the accompanying drawings of the embodiments of this application are used to distinguish between similar objects without having to describe a specific order or sequence. It should be understood that, data used in this way may be interchanged under appropriate circumstances, so that the embodiments of this application described herein can be implemented in an order other than that illustrated or described herein. In addition, the terms "including" and "having" and any of their variants are intended to cover non-exclusive inclusions. For example, a process, method, system, product, or device that includes a series of steps or units is not necessarily limited to those steps or units clearly listed, and may include other steps or units that are not clearly listed or are inherent to the process, method, product, or device.

The term "a plurality of" in this specification refers to two or more. The term "and/or" in this specification describes only an association relationship for describing associated objects and represents that three relationships can exist. For example, "A and/or B" can represent the following three cases: Only A exists, both A and B exist, and only B exists. In addition, the character "/" in this specification generally indicates an "or" relationship between the associated objects. In a formula, the character "/" indicates that the associated objects are in a "division" relationship.

It can be understood that, in the embodiments of this application, various numeric numbers are distinguished merely for ease of description and are not used to limit the scope of the embodiments of this application.

It can be understood that, in the embodiments of this application, a sequence number of each of the foregoing processes does not mean a sequence of execution. The sequence of execution of the processes should be determined based on functions and internal logic of the processes, and no limitation should be imposed on an implementation process of the embodiments of this application.

What is claimed is:

1. A circuit board assembly, used in an electronic device, comprising at least the following:
   a frame plate, comprising a frame body and first pads, wherein the first pads are provided on the frame body;
   circuit boards, each provided on one side of the frame plate, wherein the circuit board comprises a board body and second pads, the second pads are provided on the board body, and the first pads face the second pads;
   support bodies, provided between the frame plate and the circuit boards, wherein the support bodies are configured to support the circuit boards, so that a predetermined spacing exists between the first pads and the second pads, the support bodies each comprise a first support portion and a second support portion, the first support portion and the second support portion are stacked along a thickness direction of the frame plate, the first support portion is connected to the frame body, and the second support portion is connected to the board body; and
   solder joints, provided between the first pads and the second pads, wherein the solder joints connect the first pads to the second pads, wherein the frame body is an annular structure, and two or more support bodies are spaced along a circumferential direction of the frame body.

2. The circuit board assembly according to claim 1, wherein two or more support bodies are evenly distributed along the circumferential direction of the frame body.

3. The circuit board assembly according to claim 1, wherein both the first support portion and the second support portion are solder resist layers.

4. The circuit board assembly according to claim 3, wherein both the first support portion and the second support portion are first solder resist ink layers.

5. The circuit board assembly according to claim 1, wherein the first support portion has a uniform thickness, and the second support portion has a uniform thickness.

6. The circuit board assembly according to claim 5, wherein the thickness of the first support portion is equal to the thickness of the second support portion.

7. The circuit board assembly according to claim 1, wherein the support body further comprises a third support portion and a fourth support portion, the first support portion, the second support portion, the third support portion, and the fourth support portion are stacked, the third support portion is provided on a surface of the first support portion that faces the second support portion, and the fourth support portion is provided on a surface of the second support portion that faces the first support portion.

8. The circuit board assembly according to claim 7, wherein both the third support portion and the fourth support portion are solder resist layers.

9. The circuit board assembly according to claim 8, wherein both the third support portion and the fourth support portion are second solder resist ink layers; or both the third support portion and the fourth support portion are insulating sheets.

10. The circuit board assembly according to claim 7, wherein a sum of thicknesses of the first support portion and the third support portion is equal to a sum of thicknesses of the second support portion and the fourth support portion.

11. The circuit board assembly according to claim 10, wherein the third support portion has a uniform thickness, and the fourth support portion has a uniform thickness.

12. The circuit board assembly according to claim 11, wherein the thickness of the third support portion is equal to the thickness of the fourth support portion.

13. The circuit board assembly according to claim 1, wherein the frame plate further comprises third pads, the third pads are provided on the frame body, the third pads each are covered by the first support portion, and the circuit board further comprises fourth pads, the third pads face the fourth pads, and the fourth pads each are covered by the second support portion.

14. The circuit board assembly according to claim 13, wherein a surface of the first pad that faces the second pad is flush with a surface of the third pad that faces the fourth pad, and a surface of the second pad that faces the first pad is flush with a surface of the fourth pad that faces the third pad.

15. An electronic device, comprising:
   a circuit board assembly, comprising:
   a frame plate, comprising a frame body and first pads, wherein the first pads are provided on the frame body;
   circuit boards, each provided on one side of the frame plate, wherein the circuit board comprises a board body and second pads, the second pads are provided on the board body, and the first pads face the second pads;
   support bodies, provided between the frame plate and the circuit boards, wherein the support bodies are configured to support the circuit boards, so that a predetermined spacing exists between the first pads and the second pads, the support bodies each comprise a first support portion and a second support portion, the first support portion and the second support portion are stacked along a thickness direction of the frame plate, the first support portion is connected to the frame body, and the second support portion is connected to the board body; and
   solder joints, provided between the first pads and the second pads, wherein the solder joints connect the first pads to the second pads, wherein the frame body is an annular structure, and two or more support bodies are spaced along a circumferential direction of the frame body.

16. The electronic device according to claim 15, wherein two or more support bodies are evenly distributed along the circumferential direction of the frame body.

17. The electronic device according to claim 15, wherein both the first support portion and the second support portion are solder resist layers.

18. The electronic device according to claim 17, wherein both the first support portion and the second support portion are first solder resist ink layers.

19. The electronic device according to claim 15, wherein the first support portion has a uniform thickness, and the second support portion has a uniform thickness.

* * * * *